United States Patent
Kim et al.

(10) Patent No.: US 10,747,123 B2
(45) Date of Patent: Aug. 18, 2020

(54) SEMICONDUCTOR DEVICE HAVING OVERLAY PATTERN

(71) Applicant: SAMSUNG ELECTRONICS CO., LTD., Suwon-si, Gyeonggi-do (KR)

(72) Inventors: Tae-sun Kim, Hwaseong-si (KR); Young-sik Park, Hwaseong-si (KR); Min-keun Kwak, Suwon-si (KR); Byoung-hoon Kim, Yongin-si (KR); Yong-chul Kim, Daejeon (KR); Hyun-jeong Lee, Hwaseong-si (KR); Sung-won Choi, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/196,626

(22) Filed: Nov. 20, 2018

(65) Prior Publication Data

US 2019/0155174 A1    May 23, 2019

(30) Foreign Application Priority Data

Nov. 21, 2017  (KR) .................. 10-2017-0155815

(51) Int. Cl.
*G03F 7/20* (2006.01)
*G06T 7/00* (2017.01)
*H01L 23/544* (2006.01)
*H01L 21/68* (2006.01)
*G01N 21/95* (2006.01)
*G01N 21/956* (2006.01)

(52) U.S. Cl.
CPC ..... *G03F 7/70633* (2013.01); *G01N 21/9501* (2013.01); *G01N 21/95607* (2013.01); *G06T 7/001* (2013.01); *H01L 21/681* (2013.01); *H01L 23/544* (2013.01); *G06T 2207/10061* (2013.01); *G06T 2207/30148* (2013.01); *H01L 2223/54426* (2013.01)

(58) Field of Classification Search
CPC ............ G03F 7/70633; G01N 21/9501; G01N 21/95607; G06T 7/001; G06T 2207/10061; G06T 2207/30148; H01L 21/681; H01L 23/544; H01L 2223/54426
See application file for complete search history.

(56) References Cited

U.S. PATENT DOCUMENTS

| | | | |
|---|---|---|---|
| 7,876,438 B2 | 1/2011 | Ghinovker et al. |
| 8,148,682 B2 | 4/2012 | Hotta et al. |
| 9,007,571 B2 | 4/2015 | Tzai et al. |
| 9,156,306 B2 | 10/2015 | Pain et al. |

(Continued)

FOREIGN PATENT DOCUMENTS

| | | |
|---|---|---|
| JP | 2016-058637 A | 4/2016 |
| JP | 2017-509013 A | 3/2017 |
| KR | 10-2010-0089503 A | 8/2010 |

*Primary Examiner* — Fernando L Toledo
*Assistant Examiner* — Neil R Prasad
(74) *Attorney, Agent, or Firm* — Lee IP Law, PC

(57) ABSTRACT

A semiconductor device includes a semiconductor substrate including an in-cell area and a scribe lane defining the in-cell area, a first overlay pattern on the semiconductor substrate, and a second overlay pattern adjacent to the first overlay pattern, wherein the first overlay pattern is a diffraction-based overlay (DBO) pattern and the second overlay pattern is a scanning electron microscope (SEM) overlay pattern.

20 Claims, 17 Drawing Sheets

(56) References Cited

U.S. PATENT DOCUMENTS

| | | | |
|---|---|---|---|
| 9,223,227 B2 | 12/2015 | Bhattacharyya et al. | |
| 9,390,885 B2 | 12/2016 | Yamamoto et al. | |
| 2011/0155904 A1* | 6/2011 | Hotta | G03F 7/70466 |
| | | | 250/307 |
| 2011/0229830 A1* | 9/2011 | Bhattacharyya | G03F 7/70633 |
| | | | 430/325 |
| 2014/0375793 A1 | 12/2014 | Harada et al. | |
| 2016/0033398 A1* | 2/2016 | Kim | G03F 7/70625 |
| | | | 356/243.1 |
| 2017/0109646 A1* | 4/2017 | David | H01L 22/12 |
| 2017/0176871 A1 | 6/2017 | Van Buel et al. | |
| 2017/0322021 A1 | 11/2017 | Takagi et al. | |

\* cited by examiner

SEMICONDUCTOR DEVICE HAVING OVERLAY PATTERN

CROSS-REFERENCE TO RELATED APPLICATION

Korean Patent Application No. 10-2017-0155815, filed on Nov. 21, 2017, in the Korean Intellectual Property Office, and entitled: "Semiconductor Device Having Overlay Pattern," is incorporated by reference herein in its entirety.

BACKGROUND

1. Field

Embodiments relate to a semiconductor device having an overlay pattern.

2. Description of the Related Art

Various methods have been used to align within an error range an overlay between layers.

SUMMARY

Embodiments are directed to a semiconductor device, including a semiconductor substrate including an in-cell area and a scribe lane defining the in-cell area, a first overlay pattern on the semiconductor substrate, and a second overlay pattern adjacent to the first overlay pattern. The first overlay pattern may be a diffraction-based overlay (DBO) pattern, and the second overlay pattern may be a scanning electron microscope (SEM) overlay pattern.

Embodiments are also directed to a semiconductor device, including a semiconductor substrate, a first overlay pattern on the semiconductor substrate, the first overlay pattern including line-and-space patterns each extending in a first direction and a second direction perpendicular to the first direction, and a second overlay pattern on the semiconductor substrate, the second overlay pattern surrounding the first overlay pattern within a forbidden region surrounding the first overlay pattern.

Embodiments are also directed to a semiconductor device, including a semiconductor substrate including an in-cell area and a scribe lane defining the in-cell area, a first overlay pattern on the semiconductor substrate, and a second overlay pattern adjacent to the first overlay pattern, the second overlay pattern being in a forbidden region of the first overlay pattern.

Embodiments are also directed to a method of manufacturing a semiconductor device, including forming a photoresist pattern on a substrate, measuring a first overlay consistency by using a first overlay pattern, performing etching by using the photoresist pattern if the first overlay consistency is within an allowable error range, measuring a second overlay consistency by using a second overlay pattern, performing a subsequent process if the second overlay consistency is within an allowable error range, and feeding back the measured first overlay consistency and the measured second overlay consistency to a controller.

BRIEF DESCRIPTION OF THE DRAWINGS

Features will become apparent to those of skill in the art by describing in detail example embodiments with reference to the attached drawings in which.

DETAILED DESCRIPTION

Figure 1:
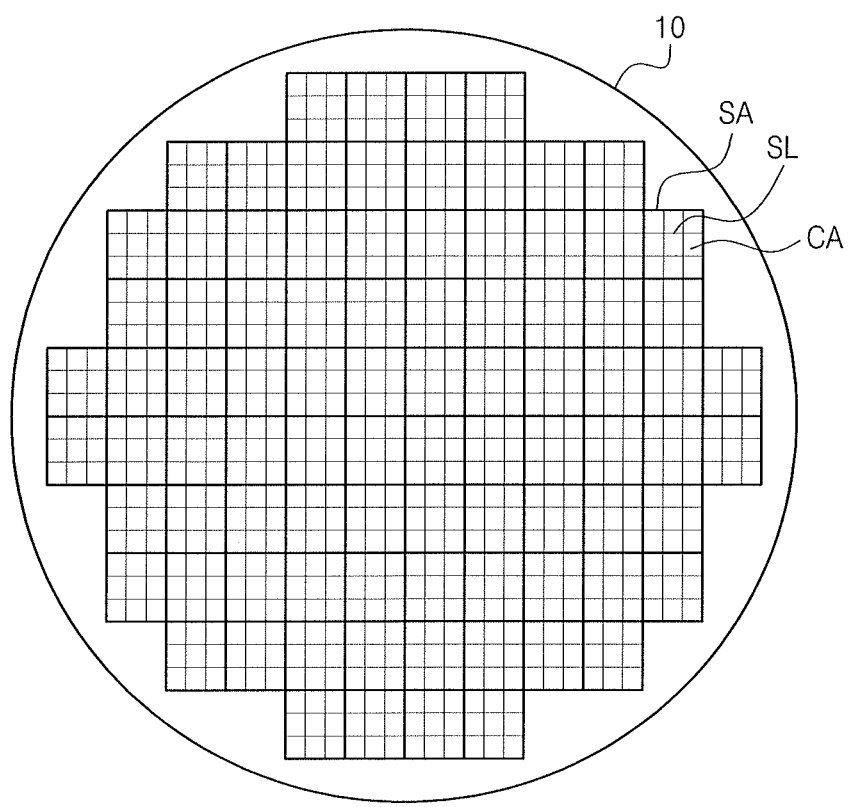
FIG. 1 illustrates a plan view of a semiconductor substrate for forming a semiconductor device according to an example embodiment.
Figure 2:
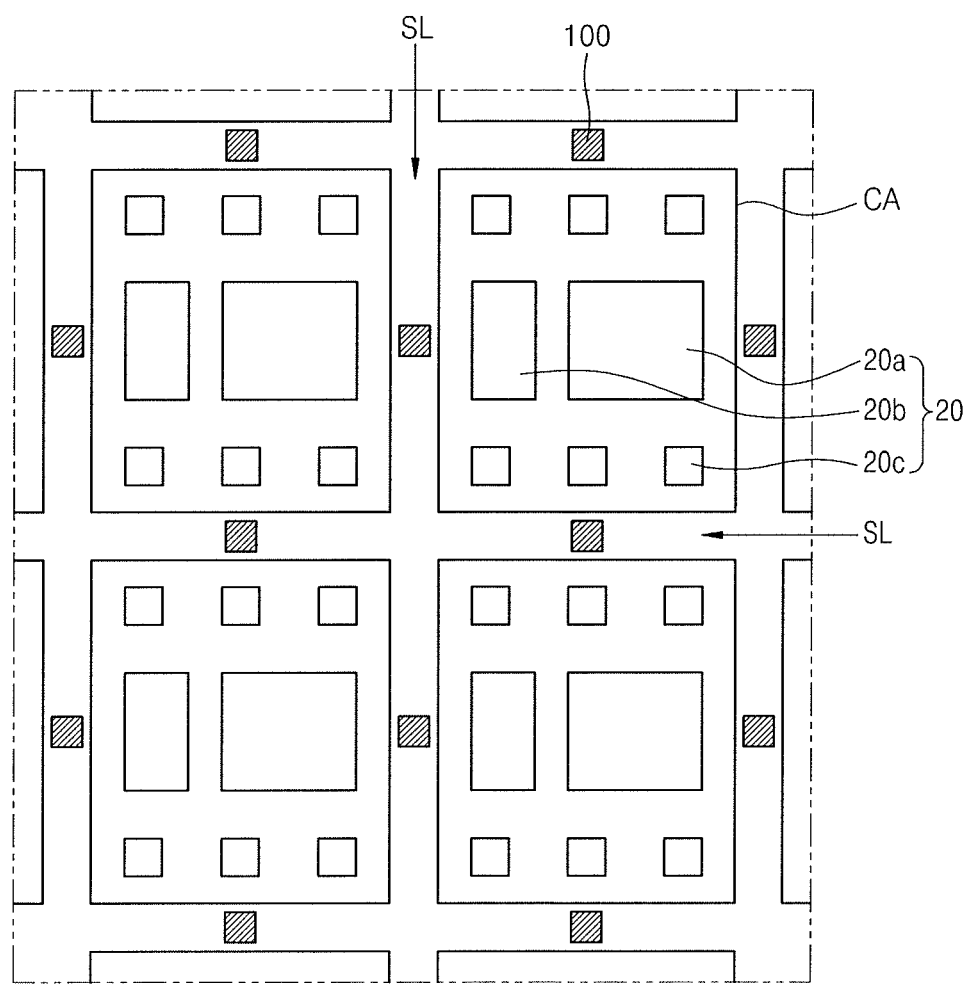
FIG. 2 illustrates an enlarged view of a portion of the semiconductor substrate of FIG. 1, which includes semiconductor dies.

FIG. 1 is a plan view illustrating a semiconductor substrate 10 for forming a semiconductor device according to an example embodiment. FIG. 2 is an enlarged view of a portion of the semiconductor substrate 10 of FIG. 1, which includes semiconductor dies.

Referring to FIGS. 1 and 2, the semiconductor substrate 10 may have a plurality of shot areas SA. Each of the shot areas SA may be an area exposed by one exposure process. One shot area SA may include one chip area CA or a plurality of chip areas CA. A scribe lane area SL may be between the chip areas CA. The chip areas CA may be defined by the scribe lane area SL.

Each of the chip areas CA may include a plurality of circuit areas 20. Each of the circuit area 20 may include, for example, a logic circuit area 20a, a memory area 20b, and an input/output device area 20c. The chip area CA may be referred to as an "in-cell area".

Referring to FIG. 2, in some example embodiments, a plurality of overlay pattern groups 100 may be substantially uniformly arranged on the semiconductor substrate 10. In some example embodiments, the plurality of overlay pattern groups 100 may be uniformly arranged on the scribe lane area SL. In some example embodiments, the plurality of overlay pattern groups 100 may be uniformly arranged on the chip area CA (in-cell area). In some example embodiments, the plurality of overlay pattern groups 100 may be uniformly arranged on the semiconductor substrate 10 irrespective of the scribe lane area SL and the chip area CA.

Figure 3A:
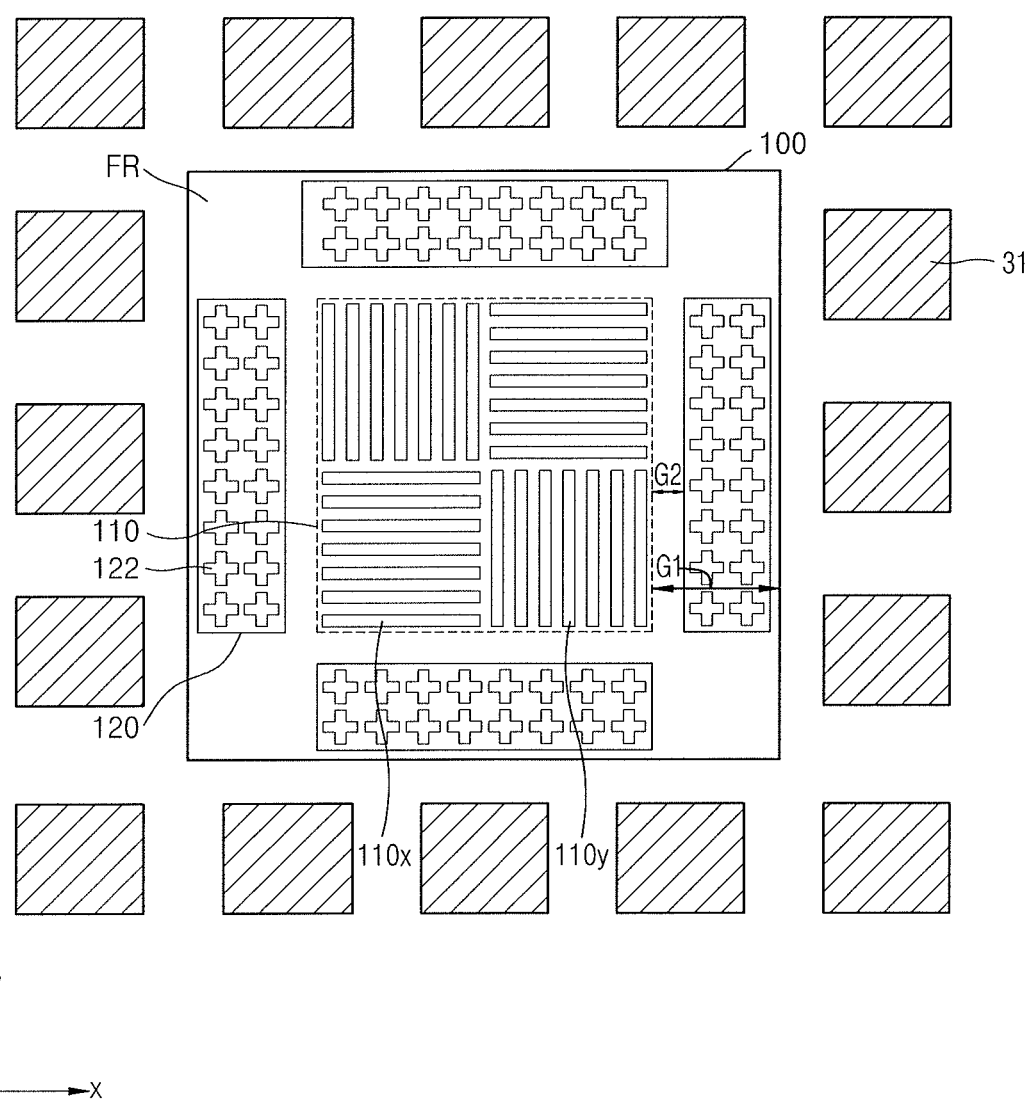
FIG. 3A illustrates an enlarged plan view of one overlay pattern group and a portion of a periphery thereof, according to an example embodiment.

FIG. 3A is an enlarged plan view illustrating one overlay pattern group 100 and a portion of a periphery thereof, according to an example embodiment.

Referring to FIG. 3A, a first overlay pattern 110 and a second overlay pattern 120 may be arranged in the overlay pattern group 100.

In some example embodiments, the first overlay pattern 110 may be located at the center of the overlay pattern group 100. The first overlay pattern 110 may include first overlay marks 110x. The first overlay marks 110x may be a plurality of line-and-space patterns extending in a first direction (e.g., x direction). In some example embodiments, the first overlay pattern 110 may includes second overlay marks 110y. The second overlay marks 110y may be a plurality of line-and-space patterns extending in a second direction (e.g., y direction) different from the first direction.

A forbidden region FR having a predetermined width G1 may be provided around the first overlay pattern 110. The width G1 may be, for example, approximately 2 micrometers. Rather than no pattern being formed in the forbidden region FR, in the present example embodiment, the second overlay pattern 120 may be provided in the forbidden region FR. In some example embodiments, the second overlay pattern 120 may be provided to surround the first overlay pattern 110.

The first overlay pattern 110 may be used to measure an overlay by using a first overlay measuring device. For example, a photoresist pattern may be formed on the first overlay pattern 110 by a photolithography process and an overlay measurement may be performed using the photoresist pattern before a subsequent process (e.g., etching process) is performed using the photoresist pattern. The first overlay pattern 110 may include the first overlay marks 110x in parallel to each other and extending in the first direction (x direction) and the second overlay marks 110y in parallel to each other and extending in the second direction (y direction).

The second overlay pattern 120 may be used to measure an overlay by using a second overlay measuring device to be described below. The second overlay pattern 120 shown in FIG. 3A may be a pattern enlarged for clarity. In some example embodiments, the second overlay pattern 120 may have a smaller planar area than that of the first overlay pattern 110.

As shown in FIG. 3A, in some example embodiments, the second overlay pattern 120 may include a plurality of sub-patterns 122. The size and/or width of the sub-patterns 122 may be less than the sizes and/or widths of the first and second overlay marks 110x and 110y of the first overlay pattern 110.

An embodiment in which the plurality of sub-patterns 122 are arranged in a lattice pattern is shown in FIG. 3A, but the plurality of sub-patterns 122 may be arranged in, for example, a zigzag pattern. In addition, an embodiment in which the plane of the second overlay pattern 120 has a cross shape is shown in FIG. 3A, but other shapes may be used.

Each of the sub-patterns 122 may have a cell pattern corresponding to the chip area CA. In some example embodiments, each of the sub-patterns 122 may be formed simultaneously with a specific cell pattern located in the chip area CA at the same level as the sub-pattern 122.

In an example embodiment, dummy patterns 31 may be provided around the overlay pattern group 100. The dummy patterns 31 may be structures or features that do not contribute to the operation of the final semiconductor device. For example, the dummy patterns 31 may alleviate a loading effect occurring during a manufacturing process of the semiconductor device.

In FIG. 3A the planar shape of each of the dummy patterns 31 is shown as a simple rectangle, but the dummy patterns 31 may have, for example, a polygon, circle, or ellipse shape.

In an example embodiment, the width G1 may be approximately 2 micrometers, and the shortest distance between the edge of the first overlay pattern 110 and the dummy pattern 31 may be at least about 2 micrometers.

In an example embodiment, the shortest distance G2 between the edge of the first overlay pattern 110 and the second overlay pattern 120 may be about 0.5 micrometer to about 1.5 micrometer. If there is no second overlay pattern 120, a void space having a width of at least 2 micrometers may be formed between the first overlay pattern 110 and the dummy pattern 31, and the edge of the first overlay pattern 110 could be damaged due to a loading effect occurring in a process of forming the semiconductor device. According to the present example embodiment, the existence of the second overlay pattern 120 may reduce the size of the void space formed around the first overlay pattern 110, thereby reducing the loading effect occurring in the process of forming the semiconductor device. As a result, damage to the first overlay pattern 110 may be reduced.

Figure 3B:
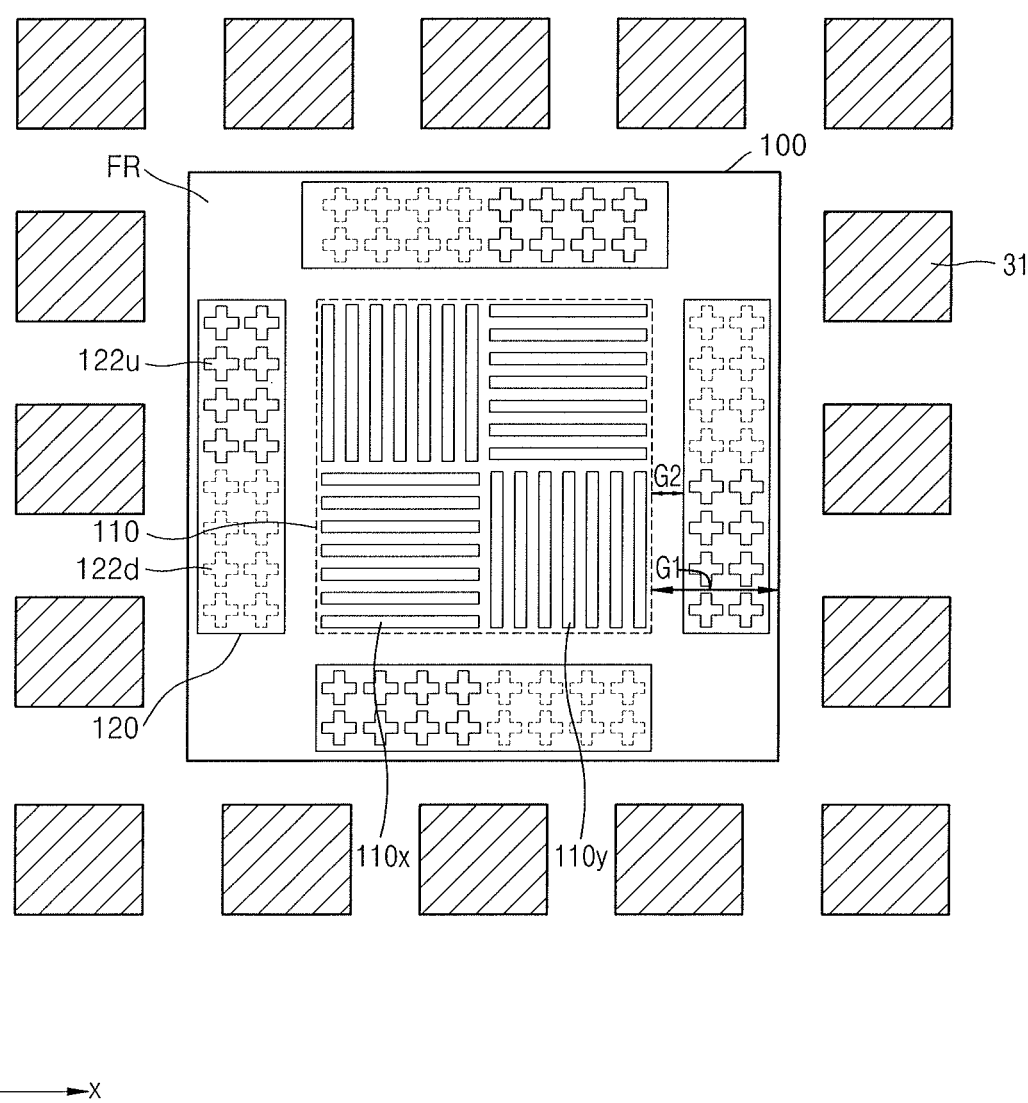
FIG. 3B illustrates an enlarged plan view of one overlay pattern group and a portion of a periphery thereof, according to another example embodiment.

FIG. 3B is an enlarged plan view illustrating one overlay pattern group 100 and a portion of a periphery thereof, according to another example embodiment.

Referring to FIG. 3B, the embodiment of FIG. 3B is the same as the embodiment of FIG. 3A except that each of second overlay patterns 120 includes an upper second overlay pattern 122u positioned in an upper layer at an upper level and a lower second overlay pattern 122d positioned in a lower layer at a lower level.

In FIG. 3B, the upper layer including the upper second overlay pattern 122u and the lower layer including the lower second overlay pattern 122d may be stacked in a direction of sight. Thus, the lower second overlay pattern 122d in the lower layer may be visually invisible or may appear blurry compared to the upper second overlay pattern 122u. Although the lower second overlay pattern 122d may be visually invisible or may appear blurry, it is possible to extract an image of the lower second overlay pattern 122d in the lower layer by scanning a high energy electron beam, e.g., an electron beam having energy of about 10 keV or more.

The extracted image of the lower second overlay pattern 122d may be utilized to measure overlay consistency of the upper and lower layers together with the upper second overlay pattern 122u. This will be described below in more detail with reference to FIGS. 9A and 9B.

Figure 4:
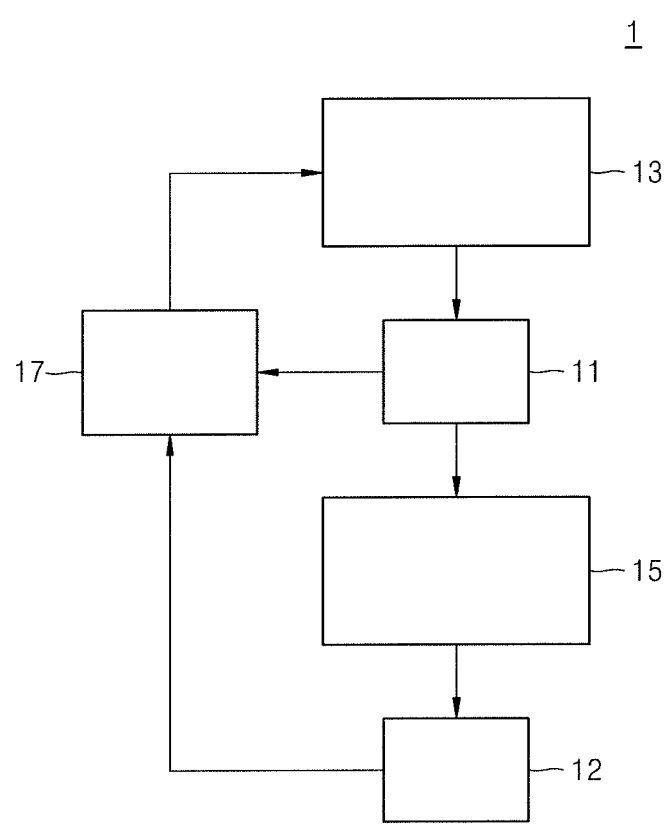
FIG. 4 illustrates a block diagram of a process system for manufacturing a semiconductor device according to an example embodiment.

FIG. 4 is a block diagram of a process system 1 for manufacturing a semiconductor device according to an example embodiment.

Referring to FIG. 4, the process system 1 may include, for example, photolithography process equipment 13 for performing a photolithography process, a first overlay measuring device 11 for measuring a first overlay by using a photoresist pattern formed by the semiconductor process equipment 15, semiconductor process equipment 15 for performing a subsequent process by using the photoresist pattern, and a second overlay measuring device 12 for measuring a second overlay by using a second overlay pattern formed using the photolithography process equipment 13. In addition, the process system 1 may include a control device 17 sending and receiving signals to and from the first and second overlay measuring devices 11 and 12.

Figure 5:
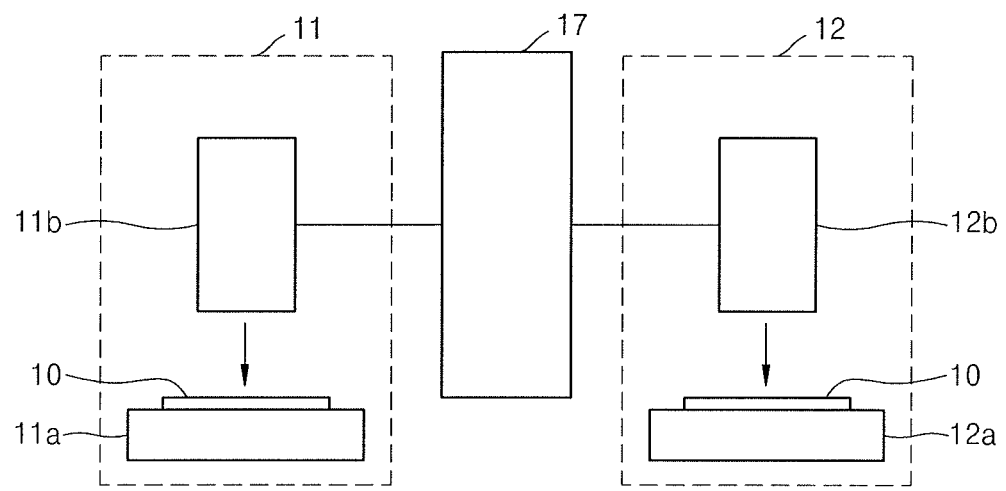
FIG. 5 illustrates a block diagram for explaining first and second overlay measuring devices and a control device.

The first and second overlay measuring devices 11 and 12 and the control device 17 will be described with reference to FIG. 5. FIG. 5 is a block diagram for explaining the first and second overlay measuring devices 11 and 12 and the control device 17.

Referring to FIGS. 4 and 5, the first overlay measuring device 11 may include a first tray 11a on which a semiconductor substrate 10 having a photoresist pattern formed by the photolithography process equipment 13 is placed, and a first measuring unit 11b performing overlay measurement by using the photoresist pattern. The first measuring unit 11b may measure an overlay of overlay target patterns by using, for example, diffraction of light, and the control device 17 may generate overlay error data by using data measured and obtained from the first measuring unit 11b. The generated overlay error data may be fed back to the photolithography process equipment 13.

The second overlay measuring device 12 may include a second tray 12a on which a semiconductor substrate 10 having a metallic overlay pattern formed by the semiconductor process equipment 15 is placed, and a second measuring unit 12b performing overlay measurement by using the metallic overlay pattern. The second overlay measuring device 12 may be a measuring device using a scanning electron microscope (SEM). For example, the second overlay measuring device 12 may scan an electron beam having a landing energy of approximately 10 keV or more to thereby extract SEM images of metallic patterns stacked in at least two or three layers. The control device 17 may generate overlay error data by using the SEM images extracted by the second overlay measuring device 12. The generated overlay error data may be fed back to the photolithography process equipment 13.

According to the present example embodiment, the process system 1 including the first and second overlay measuring devices 11 and 12 performing overlay measurement in different ways may be provided. The first overlay measuring device 11 may use a photoresist pattern. Thus, quick feedback may be possible. The second overlay measuring device 12 may use metallic patterns similar to an actual circuit pattern. Thus, the second overlay measuring device 12 may extract a misalignment value similar to the misalignment of the actual circuit pattern. Thus, overlay consistency may be enhanced. A semiconductor device formed using the process system 1 according to the present example embodiment may reduce defects due to misalignment. In addition, the process system 1 may improve productivity.

In general, overlay measurement using SEM could be performed on a pattern contributing to an actual circuit configuration among patterns of a cell area. However, doing so could cause damage to a target pattern and thus may be suitable to be performed only a test sample. On the other hand, according to the present example embodiment, overlay measurement using SEM may be performed on a pattern not contributing to a circuit configuration, for example, a pattern such as the second overlay pattern 120 dedicated to overlay measurement using SEM. Thus, it may be possible to perform a full inspection on, for example, all dies, all wafers, or all lots.

Figure 6:
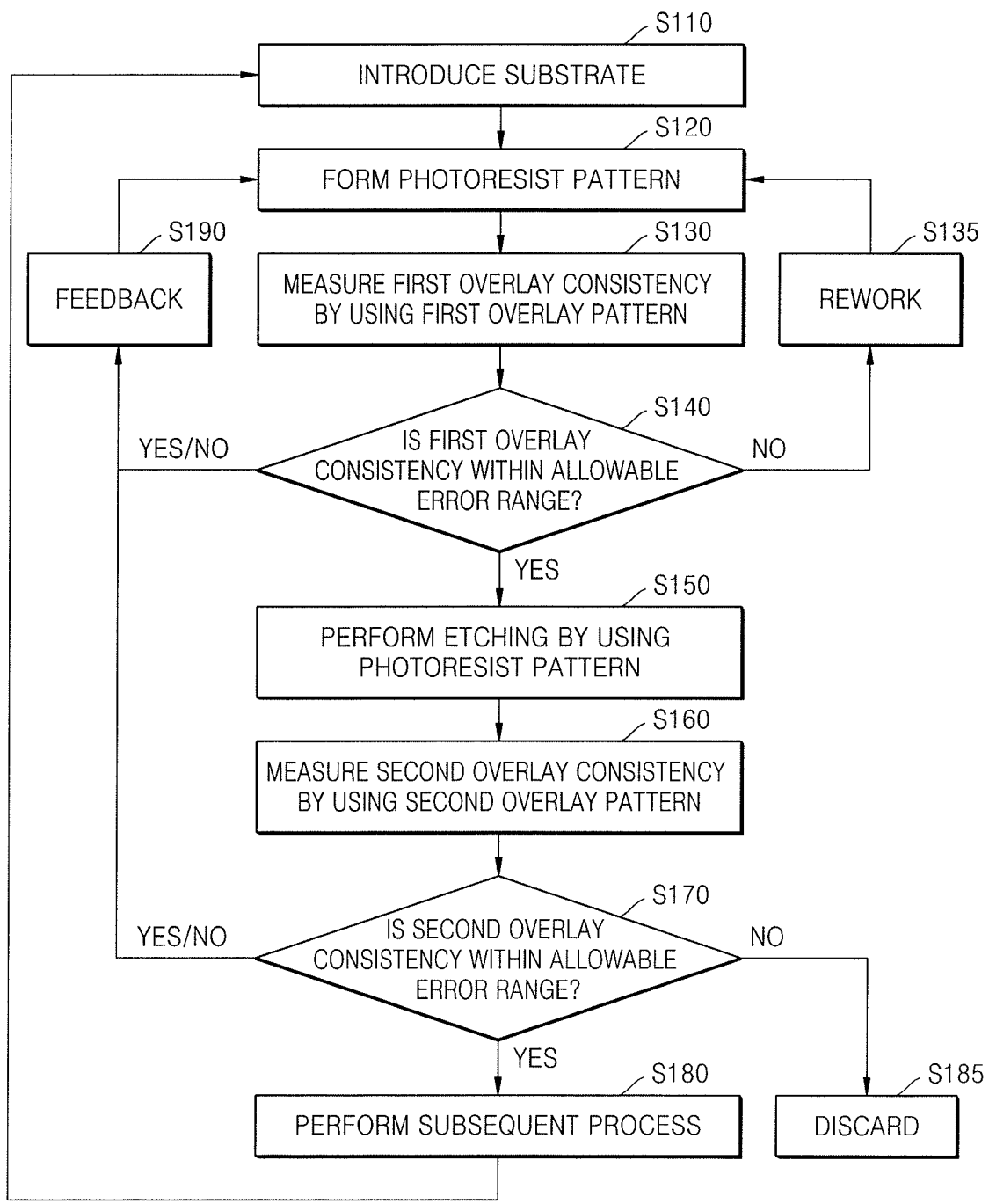
FIG. 6 illustrates a flowchart of a method of manufacturing a semiconductor device, according to an example embodiment.

FIG. 6 is a flowchart of a method of manufacturing a semiconductor device, according to an example embodiment.

Referring to FIG. 6, a substrate may be introduced into a substrate processing space (operation S110). The substrate processing space may be, for example, a processing chamber of a cluster tool.

Next, a photoresist pattern may be formed on the substrate (operation S120). The photoresist pattern may include a first overlay pattern.

Next, first overlay consistency is measured using the first overlay pattern (operation S130). For example, the first overlay consistency may be measured using the first overlay measuring device 11 of FIG. 5.

Next, it is determined whether the measured first overlay consistency is within an allowable error range (operation S140). If it is determined that the measured first overlay consistency is out of the allowable error range, the photoresist pattern formed in operation S120 may be removed and a new photoresist pattern may be formed by rework (operation S135). To this end, data related to the measured first overlay consistency may be fed back (operation S190).

If it is determined that the measured first overlay consistency is within the allowable error range, an etching process using the photoresist pattern as an etching mask may be performed as a subsequent process (operation S150). In addition, even if the first overlay consistency is not out of the allowable error range, data related to the measured first overlay consistency may be fed back in order to perform more precise processing on a next die, substrate, or lot (operation S190).

In some example embodiments, a process of forming a conductive wiring line may be additionally performed on a pattern on which etching is performed. The process of forming the conductive wiring line may be performed using, for example, a damascene process.

Next, second overlay consistency is measured using the second overlay pattern (operation S160). For example, the second overlay consistency may be measured using the second overlay measuring device 12 of FIG. 5.

Next, it is determined whether the measured second overlay consistency is within an allowable error range (operation S170). If it is determined that the measured second overlay consistency is out of the allowable error range, the substrate may be discarded (operation S185). However, even if the second overlay consistency is out of the allowable error range, in some cases, rework may be performed on the substrate, and a subsequent process may be performed after feedback of related data. In any case, data related to the measured second overlay consistency may be fed back in order to perform more precise processing on a next substrate or lot (operation S190).

If it is determined that the measured second overlay consistency is within the allowable error range, a predetermined subsequent process may be performed (operation S180). In addition, even if the second overlay consistency is not out of the allowable error range, data related to the measured second overlay consistency may be fed back in order to perform more precise processing on a next die, substrate, or lot (operation S190).

Hereinafter, a method of measuring second overlay consistency by using the second overlay pattern 120 formed in the forbidden region FR of the first overlay pattern 110 will be described in more detail.

Figure 7A:
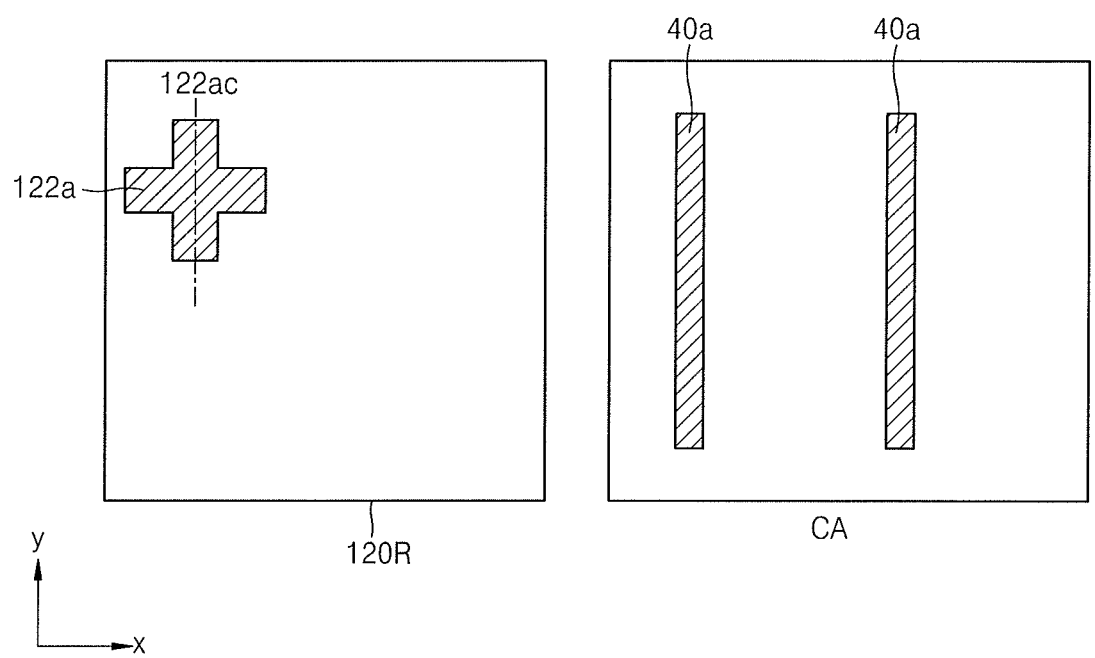
FIGS. 7A and 7B illustrate diagrams of stages in a method of measuring second overlay consistency by using a second overlay pattern and performing mis-reading correction (MRC), according to an example embodiment.
Figure 7B:
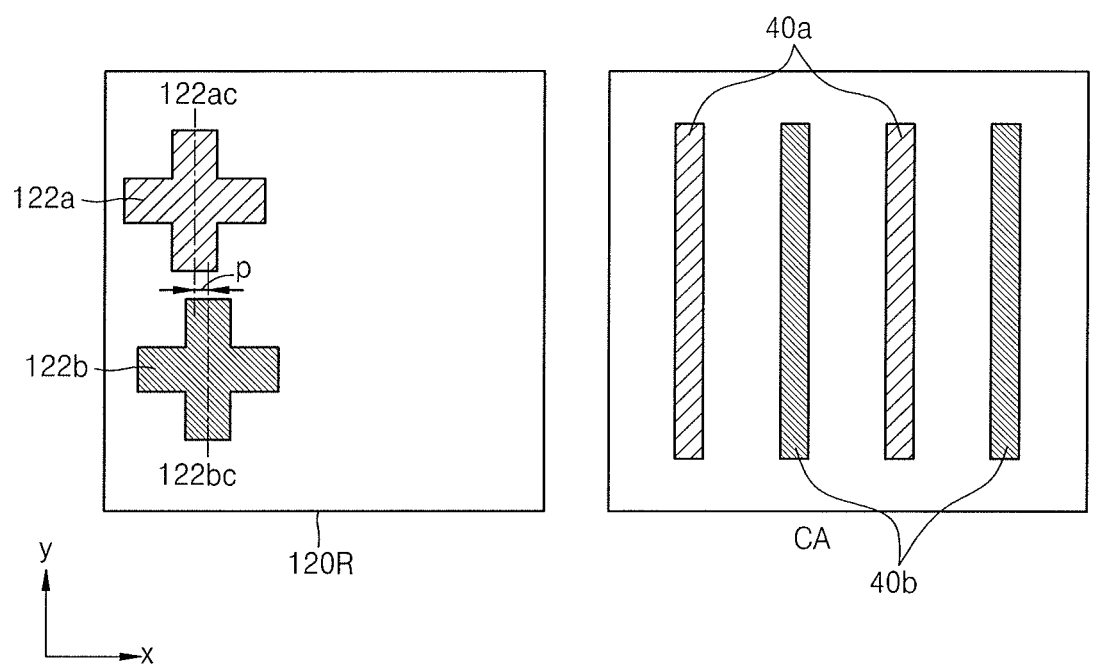

FIGS. 7A and 7B are diagrams illustrating a method of measuring second overlay consistency by using the second overlay pattern 120 and performing mis-reading correction (MRC), according to an example embodiment. In FIGS. 7A and 7B, the left side shows a second overlay pattern of a second overlay area 120R and the right side shows a pattern of an in-cell area CA.

Referring to FIG. 7A, a first cell pattern group 40*a* is formed in the in-cell area CA, and at the same time, a first sub-pattern 122*a* is formed in the second overlay area 120R.

Although the first cell pattern group 40*a* is shown as a line in FIG. 7A, the first cell pattern group 40*a* may have a form such as a combination of two or more lines, a plug, a pillar, or a polygon. In addition, the number of features constituting the first cell pattern group 40*a* may be one, or two or more.

In addition, the first cell pattern group 40*a* and the first sub-pattern 122*a* may be formed in intaglio, for example, with conductors or other specific membranes, or may include only patterns without conductors or other specific film materials. In some other embodiments, the first cell pattern group 40*a* and the first sub-pattern 122*a* may be formed as an embossment, for example, with conductors or other specific film materials.

The first sub-pattern 122*a* may correspond to the first cell pattern group 40*a*. The term "correspond" refers not only to the first sub-pattern 122*a* and the first cell pattern group 40*a* are simultaneously generated, but also to the position and orientation of the first cell pattern group 40*a* may be represented by the first sub-pattern 122*a*. When the position and orientation of the first sub-pattern 122*a* are determined, the position and orientation of the first cell pattern group 40*a* may be determined accordingly.

Referring to FIG. 7B, a second sub-pattern 122*b* and a second cell pattern group 40*b* may be formed at the same level as the first sub-pattern 122*a* and the first cell pattern group 40*a*. In the example embodiment shown in FIG. 7B, the second cell pattern group 40*b* is formed in the in-cell area CA, and at the same time, the second sub-pattern 122*b* is formed in the second overlay area 120R.

The expression 'the same level' may denote substantially the same height in a direction (a direction of sight) perpendicular to a semiconductor substrate in which patterns of the first cell pattern group 40*a*, the second cell pattern group 40*b*, the first sub-pattern 122*a*, and the second sub-pattern 122*b* are formed.

The first sub-pattern 122*a* and the second sub-pattern 122*b* may be substantially aligned in the y direction. The first sub-pattern 122*a* may have a center line 122*ac* parallel to the y axis and the second sub-pattern 122*b* may have a center line 122*bc* parallel to the y axis. In some example embodiments, the shape and size of the first sub-pattern 122*a* may be the same as those of the second sub-pattern 122*b*.

The second sub-pattern 122*b* may correspond to the second cell pattern group 40*b*. The description of the first sub-pattern 122*a* and the first cell pattern group 40*a*, given with reference to FIG. 7A, may be applied equally to the second sub-pattern 122*b* and the second cell pattern group 40*b*.

When the first sub-pattern 122*a* and the second sub-pattern 122*b* formed in the second overlay area 120R are accurately aligned with each other, for example, when the center line 122*ac* of the first sub-pattern 122*a* and the center line 122*bc* of the second sub-pattern 122*b* form a straight line within an allowable error range, it may be considered that an overlay of the second cell pattern group 40*b* relative to the first cell pattern group 40*a* is within the allowable error range.

As shown in FIG. 7B, a gap p may occur between the center line 122*ac* of the first sub-pattern 122*a* and the center line 122*bc* of the second sub-pattern 122*b*. The gap p may represent a degree to which the first sub-pattern 122*a* and the second sub-pattern 122*b* are misaligned in the x direction.

When the gap p is excessively large, a relative overlay between the first cell pattern group 40*a* and the second cell pattern group 40*b* may be determined to be out of range, so that a produced semiconductor device may be regarded as defective. Furthermore, in order to prevent additional defects by reducing the gap p to within an allowable error range, information about the size of the gap p may be fed back to the photolithography process equipment 13 (see FIG. 4) to improve overlay consistency.

When the gap p is within the allowable error range, it may be determined that the relative overlay between the first cell pattern group 40*a* and the second cell pattern group 40*b* is normal, and a subsequent process may be performed. In this case, if it is determined that the gap p is within the allowable error range but MRC needs to be performed through feedback, information about the size of the gap p may be fed back to the photolithography process equipment 13 (see FIG. 4) to further improve overlay consistency.

If the gap p is very small value so that no additional overlay is required, the feedback process may be omitted.

Figure 8A:
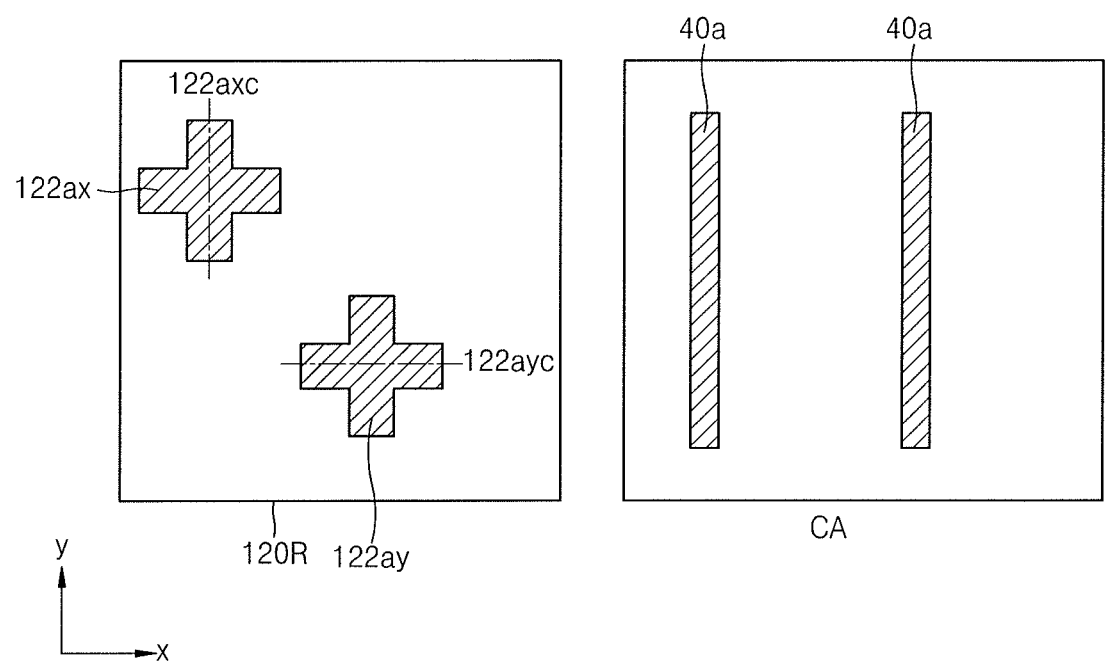
FIGS. 8A and 8B illustrate diagrams of a method of performing MRC by using a second overlay pattern, according to another example embodiment.
Figure 8B:
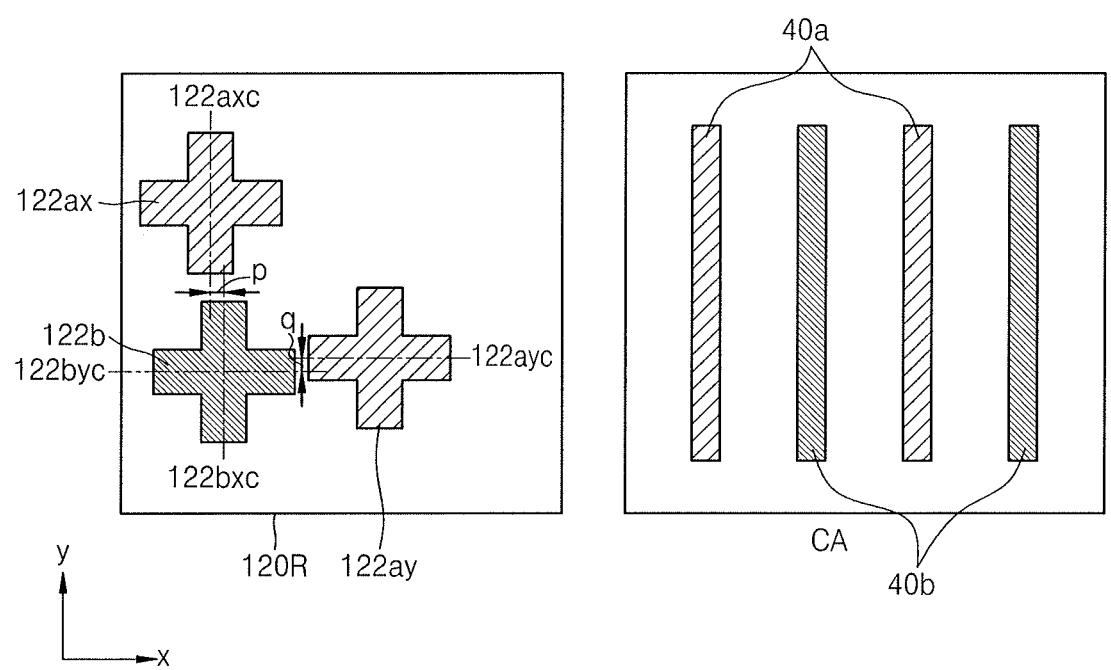

FIGS. 8A and 8B are diagrams illustrating a method of performing MRC by using the second overlay pattern 120, according to another example embodiment. In FIGS. 8A and 8B, the left side shows a second overlay pattern of a second overlay area 120R and the right side shows a pattern of an in-cell area CA.

In the example embodiment shown in FIG. 8A, a first cell pattern group 40*a* is formed in the in-cell area CA, and at the same time, a first sub-pattern 122*ax* and a third sub-pattern 122*ay* are formed in the second overlay area 120R.

Since the first cell pattern group 40*a* has been described with reference to FIG. 7A, further description will be omitted here.

The first sub-pattern 122*ax* and the third sub-pattern 122*ay* may correspond to the first cell pattern group 40*a*. Here, "corresponding" means that not only the first sub-pattern 122*ax* and the third sub-pattern 122*ay* and the first cell pattern group 40*a* are simultaneously generated, but also the position and orientation of the first cell pattern group 40*a* may be represented by the first sub-pattern 122*ax* and the third sub-pattern 122*ay*. Thus, when the positions and orientations of the first sub-pattern 122*ax* and the third sub-pattern 122*ay* are determined, the position and orientation of the first cell pattern group 40*a* may be determined accordingly. In some example embodiments, when the position and orientation of the first sub-pattern 122*ax* is determined, the position and orientation of the third sub-pattern 122*ay* may also be determined, and vice versa. In this case, when the position and orientation of any one of the first sub-pattern 122*ax* and the third sub-pattern 122*ay* is determined, the position and orientation of the first cell pattern group 40*a* may be determined accordingly.

The first sub-pattern 122*ax* may have a center line 122*axc* parallel to the y direction and the third sub-pattern 122*ay* may have a center line 122*ayc* parallel to the x direction.

Referring to FIG. 8B, a second sub-pattern 122*b* and a second cell pattern group 40*b* may be formed at the same level as the first and third sub-patterns 122*ax* and 122*ay* and the first cell pattern group 40*a*. As shown in FIG. 8B, the second cell pattern group 40*b* is formed in the in-cell area CA, and at the same time, the second sub-pattern 122*b* is formed in the second overlay area 120R.

The first sub-pattern 122*ax* and the second sub-pattern 122*b* may be substantially aligned in the y direction. The second sub-pattern 122*b* and the third sub-pattern 122*ay* may be substantially aligned in the x direction. In some example embodiments, the second sub-pattern 122b may have a center line 122byc parallel to the x-axis and a center line 122bxc parallel to the y-axis. In some example embodiments, the first sub-pattern 122ax, the second sub-pattern 122b, and the third sub-pattern 122ay may be identical in shape and size.

The second sub-pattern 122b may correspond to the second cell pattern group 40b. The description of the first and third sub-patterns 122ax and 122ay and the first cell pattern group 40a, given with reference to FIG. 8A, may be applied equally to the second sub-pattern 122b and the second cell pattern group 40b.

Whether or not an overlay of the first cell pattern group 40a and the second cell pattern group 40b in the x direction is within an allowable error range may be determined by checking the relative positions of the first sub-pattern 122ax and the second sub-pattern 122b.

When the first sub-pattern 122ax and the second sub-pattern 122b formed in the second overlay area 120R are accurately aligned with each other, for example, when the center line 122axc of the first sub-pattern 122ax and the center line 122bxc of the second sub-pattern 122b, which are parallel to the y direction, are in a straight line within an allowable error range, it may be considered that an overlay of the second cell pattern group 40b relative to the first cell pattern group 40a in the x direction is within an allowable error range.

As shown in FIG. 8B, a gap p may occur between the center line 122axc of the first sub-pattern 122ax and the center line 122bxc of the second sub-pattern 122b. The gap p may represent a degree to which the first sub-pattern 122ax and the second sub-pattern 122b are misaligned in the x direction.

Whether or not an overlay of the first cell pattern group 40a and the second cell pattern group 40b in the y direction is within an allowable error range may be determined by checking the relative positions of the third sub-pattern 122ay and the second sub-pattern 122b.

When the third sub-pattern 122ay and the second sub-pattern 122b formed in the second overlay area 120R are accurately aligned with each other, for example, when the center line 122ayc of the third sub-pattern 122ay and the center line 122byc of the second sub-pattern 122b, which are parallel to the x direction, are in a straight line within an allowable error range, it may be considered that an overlay of the second cell pattern group 40b relative to the first cell pattern group 40a in the y direction is within an allowable error range.

When the gap p and/or the gap q are excessively large, a relative overlay between the first cell pattern group 40a and the second cell pattern group 40b may be out of range, so that a produced semiconductor device may be regarded as defective. Furthermore, in order to prevent additional defects by reducing the gap p and/or the gap q to within an allowable error range, information about the sizes of the gap p and/or the gap q may be fed back to the photolithography process equipment 13 (see FIG. 4) to improve overlay consistency.

When the gap p and the gap q are within the allowable error range, it may be determined that the relative overlay between the first cell pattern group 40a and the second cell pattern group 40b is normal, and a subsequent process may be performed. In this case, if it is determined that the gap p and the gap q are within the allowable error range but MRC needs to be performed through feedback, information about the sizes of the gap p and the gap q may be fed back to the photolithography process equipment 13 (see FIG. 4) to further improve overlay consistency.

If the gap p and the gap q are such small values that no additional overlay is required, the feedback process may be omitted.

In FIGS. 7A to 8B, when forming a plurality of line-and-space patterns in the in-cell area CA, the plurality of line-and-space patterns are classified into two cell pattern groups, i.e., the first and second cell pattern groups 40a and 40b, and the two cell pattern groups are not simultaneously formed but sequentially formed. This process may be, for example, a process commonly referred to as litho-etch-litho-etch (LELE).

Although FIGS. 7A to 8B show an example in which cell patterns are classified into two cell pattern groups, the cell patterns may be classified into three or more cell pattern groups, e.g., four cell pattern groups or eight cell pattern groups, to sequentially form the cell patterns for each group.

When cell patterns are classified into three or more cell pattern groups and the three or more cell pattern groups are sequentially formed on a substrate, the number of sub-patterns of the second overlay pattern 120 may increase corresponding to the number of cell pattern groups.

In the overlay pattern group 100 shown in FIG. 3A, the plurality of sub-patterns 122 in the forbidden region FR are shown as part of the second overlay pattern 120, and some of the sub-patterns 122 may serve only as dummy patterns.

Figure 9A:
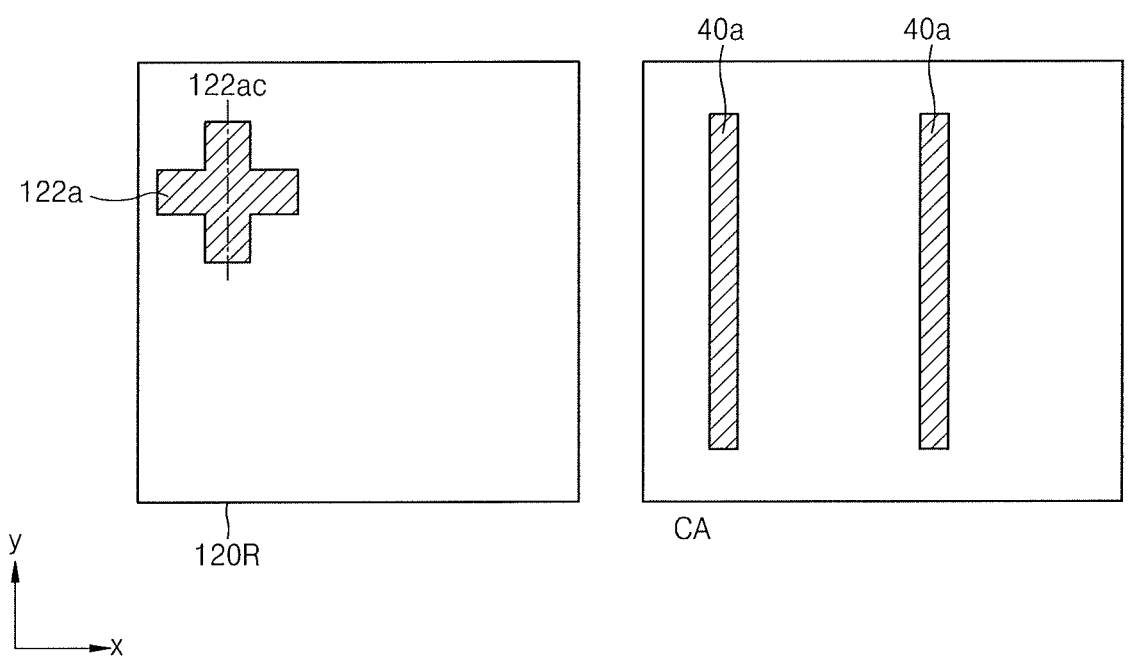
FIGS. 9A and 9B illustrate diagrams of a method of performing MRC by using a second overlay pattern, according to another example embodiment.
Figure 9B:
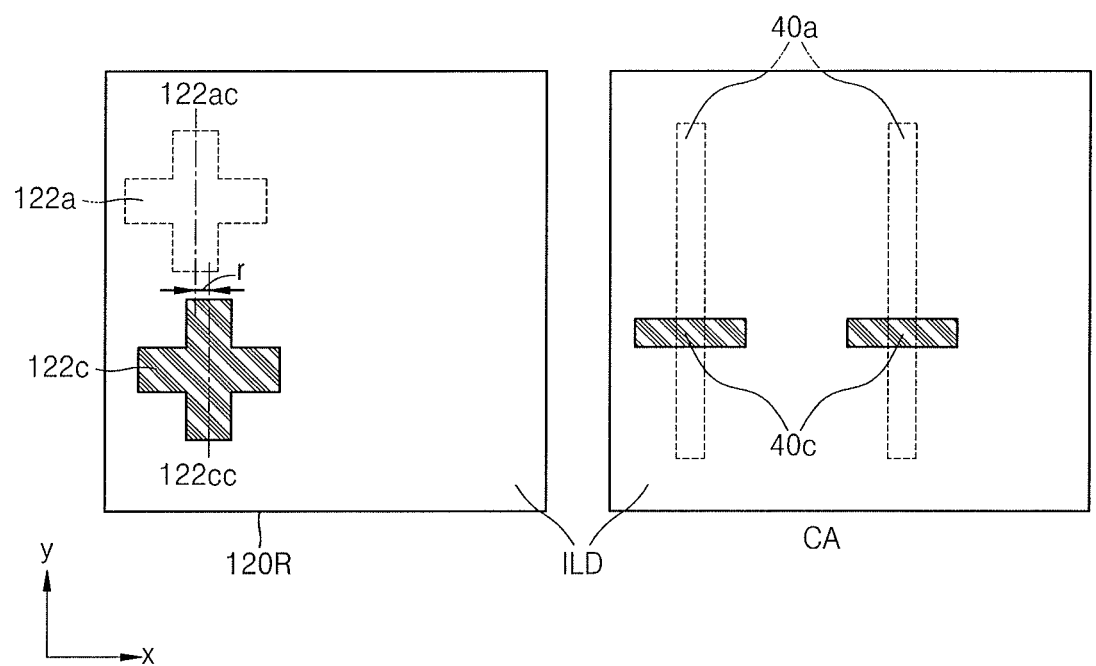

FIGS. 9A and 9B are diagrams illustrating a method for performing MRC by using the second overlay pattern 120, according to another example embodiment. In FIGS. 9A and 9B, the left side shows a second overlay pattern of a second overlay area 120R and the right side shows a pattern of an in-cell area CA.

Referring to FIG. 9A, a first cell pattern group 40a is formed in the in-cell area CA, and at the same time, a first sub-pattern 122a is formed in the second overlay area 120R. Both the first cell pattern group 40a and the first sub-pattern 122a may be formed at a first level having a first height.

Since the first cell pattern group 40a has been described with reference to FIG. 7A, further description will be omitted here. The first sub-pattern 122a may correspond to the first cell pattern group 40a.

Referring to FIG. 9B, an interlayer insulating layer ILD may be formed to cover both the first cell pattern group 40a and the first sub-pattern 122a, and a third cell pattern group 40c and a fourth sub-pattern 122c may be formed in a layer having a higher level. The third cell pattern group 40c and the fourth sub-pattern 122c may be formed at a second level having a second height, and the second height may be greater than the first height.

As shown in FIG. 9B, the third cell pattern group 40c may be formed in the in-cell area CA, and at the same time, the fourth sub-pattern 122c may be formed in the second overlay area 120R.

The first sub-pattern 122a and the fourth sub-pattern 122c may be substantially aligned in the y direction. The first sub-pattern 122a may have a center line 122ac parallel to the y-axis and the fourth sub-pattern 122c may have a center line 122cc parallel to the y-axis. In some example embodiments, the first sub-pattern 122a and the fourth sub-pattern 122c may be identical in shape and size.

The fourth sub-pattern 122c may correspond to the third cell pattern group 40c. The description of the first sub-pattern 122a and the first cell pattern group 40a, given with reference to FIG. 7A, may be applied equally to the fourth sub-pattern 122c and the third cell pattern group 40c.

When the first sub-pattern 122a and the fourth sub-pattern 122c formed in the second overlay area 120R are accurately aligned with each other, for example, when the center line 122ac of the first sub-pattern 122a and the center line 122cc of the fourth sub-pattern 122c are in a straight line within an allowable error range, it may be considered that an overlay of the third cell pattern group 40c relative to the first cell pattern group 40a is within an allowable error range.

As shown in FIG. 9B, a gap r may occur between the center line 122ac of the first sub-pattern 122a and the center line 122cc of the fourth sub-pattern 122c. The gap r may represent a degree to which the first sub-pattern 122a and the fourth sub-pattern 122c are misaligned in the x direction.

When the gap r is excessively large, a relative overlay between the first cell pattern group 40a and the third cell pattern group 40c may be out of range, so that a produced semiconductor device may be regarded as defective. Furthermore, in order to prevent additional defects by reducing the gap r to within an allowable error range, information about the size of the gap r may be fed back to the photolithography process equipment 13 (see FIG. 4) to improve overlay consistency.

When the gap r is within the allowable error range, it may be determined that the relative overlay between the first cell pattern group 40a and the third cell pattern group 40c is normal, and a subsequent process may be performed. In this case, if it is determined that the gap r is within the allowable error range but MRC needs to be performed through feedback, information about the size of the gap r may be fed back to the photolithography process equipment 13 (see FIG. 4) to further improve overlay consistency.

If the gap r is such a small value that no additional overlay is required, the feedback process may be omitted.

Although the first cell pattern group 40a and the first sub-pattern 122a are covered with the interlayer insulating layer ILD, the first sub-pattern 122a may be analyzed and read using the second overlay measuring device 12 and the control device 17 described with reference to FIGS. 4 and 5 to thereby generate overlay error data.

The second overlay measuring device 12 may extract an SEM image of the first sub-pattern 122a, and the extracted SEM image of the first sub-pattern 122a may be the same as a planar image shown in FIG. 9B. The control device 17 may generate overlay error data between the first sub-pattern 122a and the fourth sub-pattern 122c by using the planar image as shown in FIG. 9B. For example, the control device 17 may receive an SEM image from the second overlay measuring device 12, and may extract the center line 122ac of the first sub-pattern 122a and the center line 122cc of the fourth sub-pattern 122c.

Figure 10A:
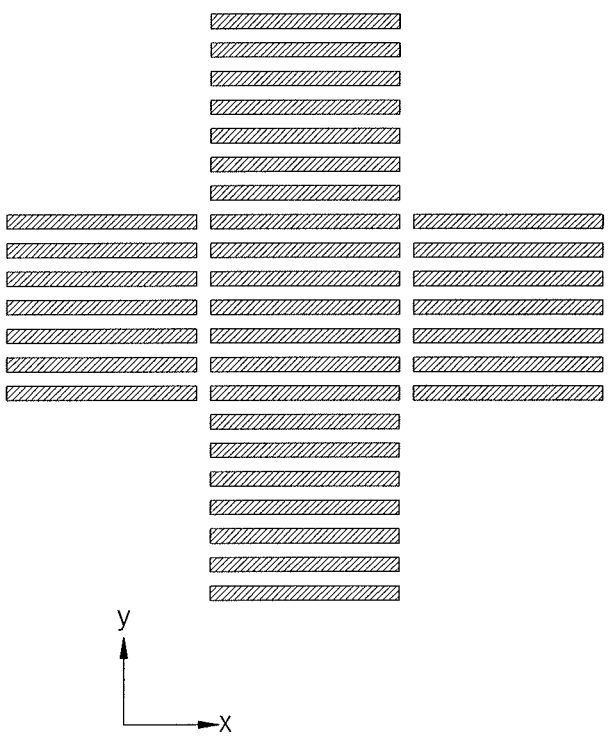
FIGS. 10A to 10C illustrate individual sub-patterns according to example embodiments.
Figure 10B:
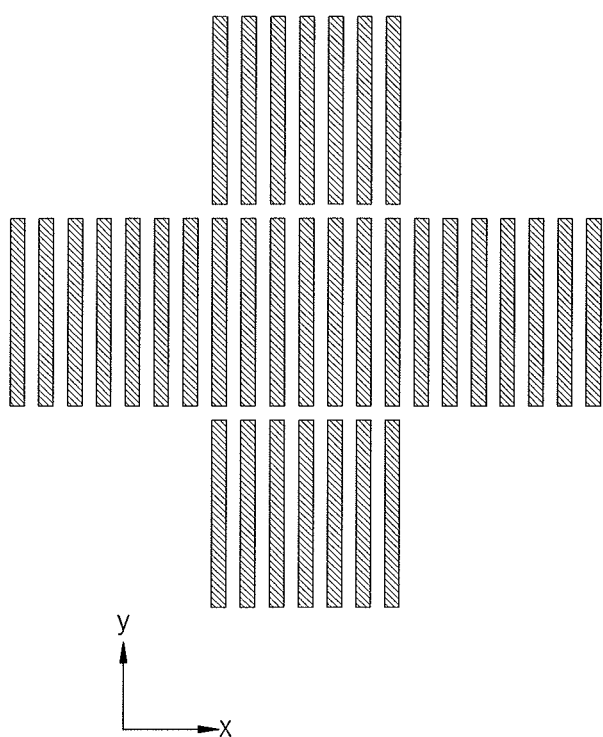
Figure 10C:
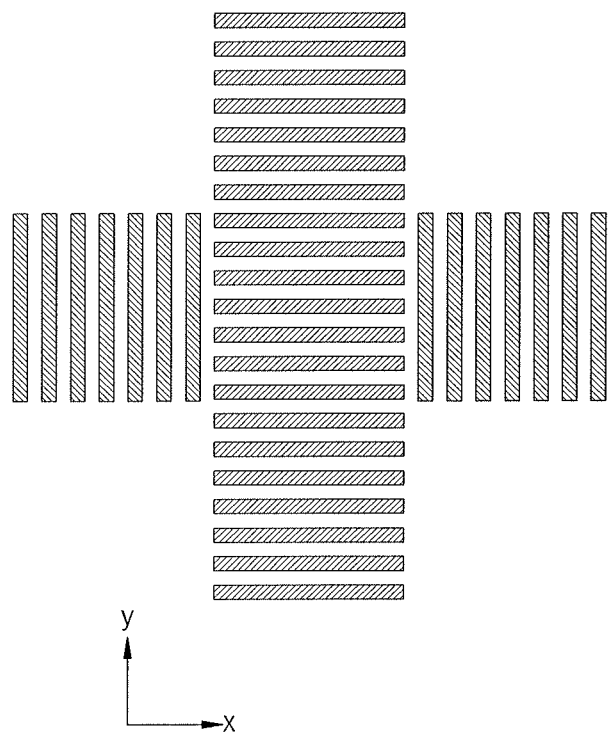

FIGS. 10A to 10C illustrate alternative embodiments of individual sub-patterns according to example embodiments.

Referring to FIG. 10A, individual sub-patterns may be formed by slits extending in the x direction, and referring to FIG. 10B, individual sub-patterns may be formed by slits extending in the y direction. In addition, referring to FIG. 10C, some of the individual sub-patterns may be formed by slits extending in the x-direction and others may be formed by slits extending in the y-direction.

Whether to form sub-patterns by using slits extending in which direction may be determined in consideration of the nature of a light source used for exposure, a polarization direction, a phase shift, and the like.

For example, when the light source used for exposure uses off-axis illumination (OAI), specific sub-patterns may be determined depending on which one of dipole illumination, quadrupole illumination, annular illumination, and any other illumination is used as the OAI.

In some example embodiments, specific sub-patterns may be determined depending on which direction a polarization direction that polarizes light emitted from a light source is.

In some example embodiments, when a phase shift mask is used, specific sub-patterns may be determined depending on how the phase of light shifts through the phase shift mask.

Figure 11:
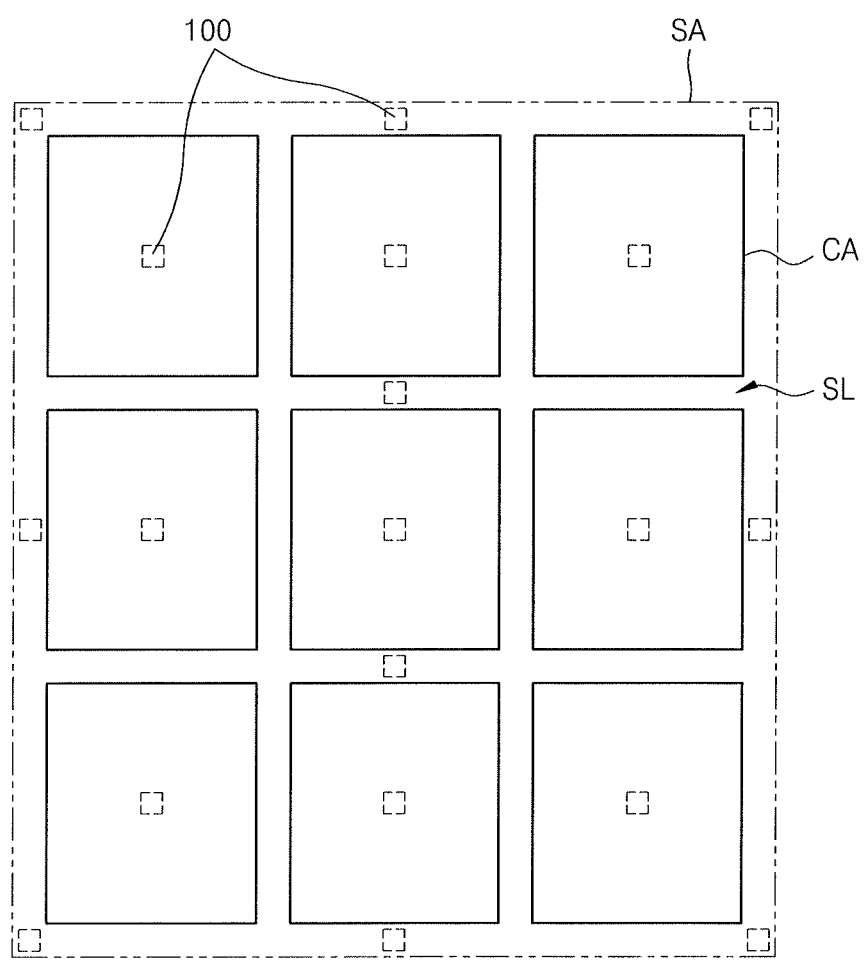
FIG. 11 illustrates a plan view for explaining an overlay pattern group arranged in one shot area.

The overlay pattern group 100 arranged in the shot area SA described with reference to FIG. 1 will be described with reference to FIG. 11. FIG. 11 is a plan view for explaining the overlay pattern group 100 arranged in one shot area SA.

Referring to FIG. 11, a plurality of overlay pattern groups 100 may be arranged and may be equally arranged in one shot area SA.

In some example embodiments, a plurality of chip areas CA may be arranged in one shot area SA. The positions of the overlay pattern groups 100 arranged in the plurality of chip areas CA may be the same. For example, the position of an overlay pattern group 100 placed in any one of the plurality of chip areas CA may be the same as the position of an overlay pattern group 100 placed in another chip area CA.

In some example embodiments, in one shot area SA, the plurality of overlay pattern groups 100 may be arranged to have a maximized dispersion. Thus, an overlay error measured and calculated using overlay patterns in the overlay pattern groups 100 may be more similar to an overlay error of circuit patterns in the chip area CA.

By way of summation and review, an optical method using a diffraction and a method using a scanning electron microscope may be considered for aligning an overlay between layers. However, as sizes of patterns to be formed on a substrate become extremely small, it may be difficult to maintain consistency of the overlay.

As described above, embodiments relate to a semiconductor device with improved overlay consistency and reduced damage to an overlay pattern.

Using overlay patterns according to the embodiments of the inventive concept may improve overlay consistency and enable full inspection by a method using SEM. Also, an overlay pattern provided in a forbidden region may function as a dummy pattern, and thus damage to a diffraction-based overlay pattern may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a semiconductor substrate comprising an in-cell area and a scribe lane defining the in-cell area;
   a first overlay pattern on the semiconductor substrate, the first overlay pattern including a first line-and-space pattern extending in a first direction and a second line-and-space pattern extending in a second direction perpendicular to the first direction; and a second overlay pattern surrounding the first overlay pattern adjacent to the first overlay pattern, wherein the first overlay pattern is a diffraction-based overlay (DBO) pattern, and the second overlay pattern is a scanning electron microscope (SEM) overlay pattern.

2. The semiconductor device as claimed in claim 1, wherein a dummy pattern is around the first overlay pattern and the second overlay pattern is between the first overlay pattern and the dummy pattern.

3. The semiconductor device as claimed in claim 2, wherein the second overlay pattern surrounds the first overlay pattern.

4. The semiconductor device as claimed in claim 2, wherein a shortest distance between an edge of the first overlay pattern and the dummy pattern is at least about 2 micrometers, and a shortest distance between the edge of the first overlay pattern and the second overlay pattern is about 0.5 micrometer to about 1.5 micrometer.

5. The semiconductor device as claimed in claim 1, wherein the first overlay pattern comprises only a first line-and-space pattern extending in a first direction.

6. The semiconductor device as claimed in claim 1, wherein the first overlay pattern comprises a first line-and-space pattern extending in a first direction and a second line-and-space pattern extending in a second direction perpendicular to the first direction.

7. The semiconductor device as claimed in claim 1, wherein the second overlay pattern comprises a first sub-pattern and a second sub-pattern respectively corresponding to a first cell pattern group and a second cell pattern group located in the in-cell area, the first cell pattern group and the second cell pattern group being at the same level.

8. The semiconductor device as claimed in claim 7, wherein:
the second overlay pattern further comprises a third sub-pattern corresponding to the first cell pattern group located in the in-cell area at the same level, and
a direction in which the first sub-pattern and the second sub-pattern are arranged is different from a direction in which the second sub-pattern and the third sub-pattern are arranged.

9. The semiconductor device as claimed in claim 1, wherein the second overlay pattern comprises a first sub-pattern and a fourth sub-pattern respectively corresponding to a first cell pattern group and a third cell pattern group located in the in-cell area, the first cell pattern group and the third cell pattern group being at a different level.

10. The semiconductor device as claimed in claim 1, wherein:
the first overlay pattern and the second overlay pattern form one overlay pattern group, and
the overlay pattern group is in the scribe lane.

11. The semiconductor device as claimed in claim 1, wherein:
the first overlay pattern and the second overlay pattern form one overlay pattern group, and
the overlay pattern group is in the in-cell area.

12. A semiconductor device, comprising:
a semiconductor substrate comprising an in-cell area and a scribe lane defining the in-cell area;
a first overlay pattern on the semiconductor substrate, the first overlay pattern comprising at least first and second line-and-space patterns, the first line and space pattern extending in a first direction and the second line and space pattern extending in a second direction perpendicular to the first direction; and
a second overlay pattern on the semiconductor substrate, the second overlay pattern surrounding the first overlay pattern within a forbidden region surrounding the first overlay pattern.

13. The semiconductor device as claimed in claim 12, wherein the second overlay pattern is dependent on an orientation of a lithographic illumination system used to manufacture the semiconductor device.

14. The semiconductor device as claimed in claim 13, wherein the second overlay pattern comprises only a line-and-space pattern extending in a same direction.

15. A semiconductor device, comprising:
a semiconductor substrate comprising an in-cell area and a scribe lane defining the in-cell area;
a first overlay pattern on the semiconductor substrate, the first overlay pattern being a diffraction-based overlay (DBO) pattern; and
a second overlay pattern adjacent to the first overlay pattern, the second overlay pattern being in a forbidden region of the first overlay pattern and being a scanning electron microscope (SEM) overlay pattern, and
wherein the second overlay pattern comprises a first sub-pattern and a second sub-pattern respectively corresponding to a first cell patter group and a second cell pattern group located in the in-cell area, the first cell pattern group and the second cell pattern group being at a different level.

16. The semiconductor device as claimed in claim 15, wherein the first overlay pattern is a diffraction-based overlay (DBO) pattern in a scribe lane.

17. The semiconductor device as claimed in claim 16, wherein the second overlay pattern is a scanning electron microscope (SEM) overlay pattern in the scribe lane.

18. The semiconductor device as claimed in claim 17, wherein:
the second overlay pattern comprises a first sub-pattern and a second sub-pattern corresponding to a first cell pattern group and a second cell pattern group, respectively, located in the in-cell area, and
the first cell pattern group and the second cell pattern group are located at a first level.

19. The semiconductor device as claimed in claim 18, wherein the second overlay pattern further comprises a fourth sub-pattern corresponding to a third cell pattern group located in the in-cell area, the fourth sub-pattern being located at a second level different from the first level.

20. The semiconductor device as claimed in claim 19, wherein:
the second level is higher than the first level, and
the first sub-pattern and the second sub-pattern are covered with an interlayer insulating layer so that images of the first sub-pattern and the second sub-pattern are extractable by SEM.

* * * * *